(12) United States Patent
Su et al.

(10) Patent No.: US 8,572,537 B2
(45) Date of Patent: Oct. 29, 2013

(54) ACCURATE PARASITIC CAPACITANCE EXTRACTION FOR ULTRA LARGE SCALE INTEGRATED CIRCUITS

(75) Inventors: Ke-Ying Su, Taipei (TW); Chia-Ming Ho, Banciao (TW); Gwan-Sin Chang, Hsin-Chu (TW); Chien-Wen Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/527,096

(22) Filed: Jun. 19, 2012

(65) Prior Publication Data
US 2012/0260225 A1 Oct. 11, 2012

Related U.S. Application Data

(62) Division of application No. 12/893,870, filed on Sep. 29, 2010, now Pat. No. 8,214,784, which is a division of application No. 11/865,304, filed on Oct. 1, 2007, now Pat. No. 7,818,698.

(60) Provisional application No. 60/947,269, filed on Jun. 29, 2007.

(51) Int. Cl.
*G06F 17/50* (2006.01)

(52) U.S. Cl.
USPC ........... 716/115; 716/110; 716/111; 716/112; 716/136

(58) Field of Classification Search
USPC ................. 716/110–112, 115, 136
See application file for complete search history.

(56) References Cited

U.S. PATENT DOCUMENTS

| | | | |
|---|---|---|---|
| 5,761,080 A | 6/1998 | DeCamp et al. | |
| 5,773,317 A * | 6/1998 | Wu et al. | 438/17 |
| 5,828,580 A | 10/1998 | Ho | |
| 5,841,164 A | 11/1998 | Tsujino et al. | |
| 5,901,063 A | 5/1999 | Chang et al. | |
| 6,080,597 A | 6/2000 | Moon | |
| 6,084,285 A | 7/2000 | Shahani | |
| 6,088,523 A * | 7/2000 | Nabors et al. | 703/14 |
| 6,185,722 B1 | 2/2001 | Darden et al. | |
| 6,219,631 B1 | 4/2001 | Oh et al. | |
| 6,243,653 B1 | 6/2001 | Findley | |
| 6,438,729 B1 | 8/2002 | Ho | |
| 6,449,754 B1 * | 9/2002 | You et al. | 716/115 |
| 6,457,163 B1 | 9/2002 | Yang | |

(Continued)

OTHER PUBLICATIONS

Cho, D.-H., et al., "Measurement and Characterization of Multi-Layered Interconnect Capacitance for Deep Submicro VLSI Technology," Proc. IEEE 1997 Int. Conference on Microelectronic Test Structures, vol. 10, Mar. 1997, pp. 91-94.

*Primary Examiner* — Naum Levin
(74) *Attorney, Agent, or Firm* — Slater & Matsil, L.L.P.

(57) ABSTRACT

A system and method for extracting the parasitic contact/via capacitance in an integrated circuit are provided. Parasitic extraction using this system can lead to an improved accuracy on contact/via parasitic capacitance extraction by taking into account of the actual contact/via shape and size variation. The common feature of the various embodiments includes the step of generating a technology file, in which the contact/via capacitance in the capacitance table is derived from an effective contact/via width table. Each element of the effective contact/via width table is calibrated to have a parasitic capacitance matching to that of an actual contact/via configuration occurring in an IC.

20 Claims, 10 Drawing Sheets

(56) References Cited

U.S. PATENT DOCUMENTS

| | | |
|---|---|---|
| 6,501,282 B1 | 12/2002 | Dummermuth et al. |
| 6,539,526 B1 | 3/2003 | Deng |
| 6,587,997 B1 * | 7/2003 | Chen et al. .................... 716/103 |
| 6,665,849 B2 * | 12/2003 | Meuris et al. ................. 716/134 |
| 6,728,942 B2 * | 4/2004 | Lampaert et al. ............. 716/102 |
| 6,756,792 B2 | 6/2004 | Armbruster |
| 6,838,869 B1 * | 1/2005 | Rogers et al. ............ 324/762.01 |
| 6,854,100 B1 * | 2/2005 | Chuang et al. ................ 716/115 |
| 6,885,214 B1 * | 4/2005 | Su et al. ................... 324/754.28 |
| 7,089,516 B2 * | 8/2006 | Arora et al. ............. 324/762.03 |
| 7,224,169 B2 * | 5/2007 | Parker ........................... 324/519 |
| 7,231,618 B2 * | 6/2007 | Huang et al. .................. 716/115 |
| 7,263,477 B2 * | 8/2007 | Chen et al. ...................... 703/13 |
| 7,320,116 B2 * | 1/2008 | Mukaihira .................... 716/115 |
| 7,348,624 B2 * | 3/2008 | Sakaguchi et al. ............ 257/307 |
| 7,355,201 B2 | 4/2008 | Zhu et al. |
| 7,772,868 B2 | 8/2010 | Doong et al. |
| 7,818,698 B2 | 10/2010 | Su et al. |
| 7,880,494 B2 | 2/2011 | Doong et al. |
| 8,115,500 B2 | 2/2012 | Doong et al. |
| 2001/0025966 A1 | 10/2001 | Mizuhara |
| 2002/0188920 A1 * | 12/2002 | Lampaert et al. ............... 716/10 |
| 2003/0122123 A1 * | 7/2003 | Deng et al. ...................... 257/48 |
| 2003/0206033 A1 | 11/2003 | Chan et al. |
| 2004/0078765 A1 | 4/2004 | Cui et al. |
| 2004/0207412 A1 | 10/2004 | Kunikiyo et al. |
| 2005/0024077 A1 | 2/2005 | Huang et al. |
| 2005/0216873 A1 | 9/2005 | Singh et al. |
| 2005/0240883 A1 | 10/2005 | Huang et al. |
| 2005/0260776 A1 | 11/2005 | Wang et al. |
| 2006/0022678 A1 * | 2/2006 | Hegazy et al. ................ 324/525 |
| 2006/0103391 A1 * | 5/2006 | Parker ........................... 324/519 |
| 2006/0107246 A1 | 5/2006 | Nakamura |
| 2006/0129955 A1 * | 6/2006 | Jacobsen et al. .................. 716/4 |
| 2006/0271888 A1 | 11/2006 | Meuris et al. |
| 2007/0087719 A1 | 4/2007 | Mandal et al. |
| 2007/0198967 A1 * | 8/2007 | Ren et al. ........................ 716/21 |
| 2008/0320428 A1 * | 12/2008 | Lin .................................. 716/10 |
| 2009/0002012 A1 * | 1/2009 | Doong et al. ................. 324/765 |
| 2009/0077507 A1 * | 3/2009 | Hou et al. ......................... 716/4 |
| 2009/0184316 A1 * | 7/2009 | Hsu et al. ......................... 257/48 |

* cited by examiner

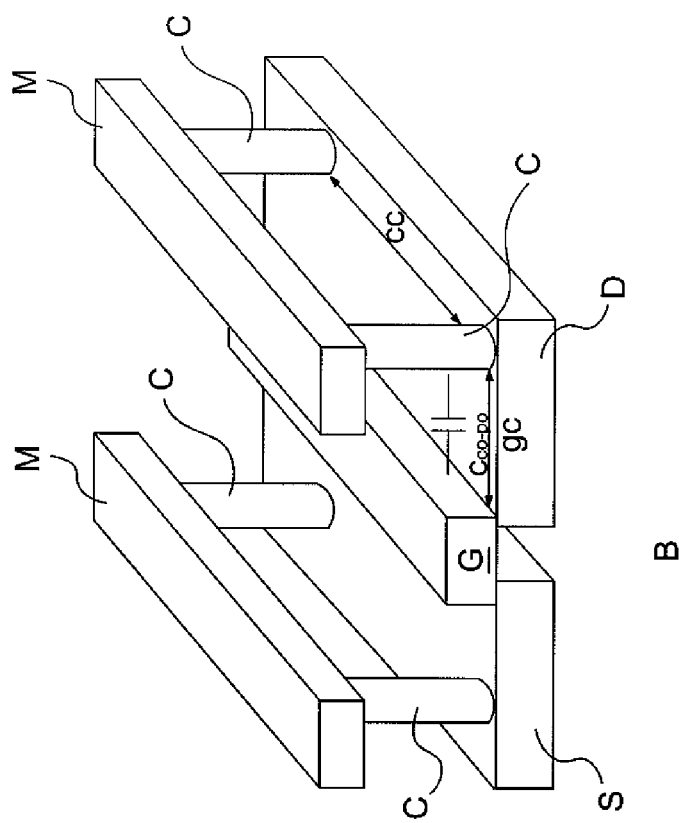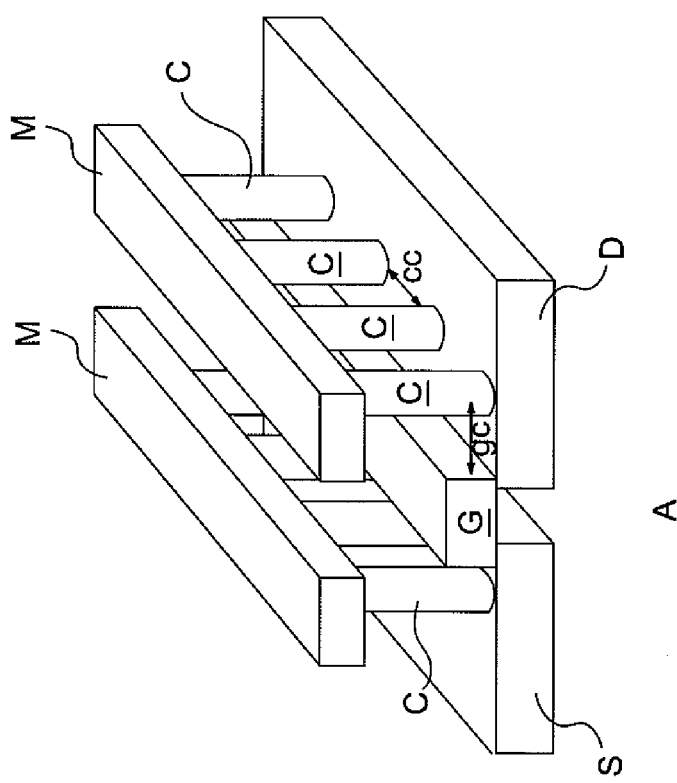
FIG. 4

| Measured $C_{CO-PO}$ (F/$\mu m^2$) | | gc (in multiple of design rule space) | | | |
|---|---|---|---|---|---|
| | | 1X | 1.5X | 2X | 3X |
| CC (multiple of design rule space) | 1X | $C_{1,1}$ | $C_{1,1.5}$ | $C_{1,2}$ | $C_{1,3}$ |
| | 1.5X | $C_{1.5,1}$ | $C_{1.5,1.5}$ | $C_{1.5,2}$ | $C_{1.5,3}$ |
| | 2X | $C_{2,1}$ | $C_{2,1.5}$ | $C_{2,2}$ | $C_{2,3}$ |
| | 2.5X | $C_{2.5,1}$ | $C_{2.5,1.5}$ | $C_{2.5,2}$ | $C_{2.5,3}$ |
| | 3X | $C_{3,1}$ | $C_{3,1.5}$ | $C_{3,2}$ | $C_{3,3}$ |

FIG. 5A

| Measured $C_V$ (F/$\mu m^2$) \ Via Density | 1X | 1.5X | 2X | 2.5X | 3X |
|---|---|---|---|---|---|
| | $Cv_1$ | $Cv_{1.5}$ | $Cv_2$ | $Cv_{2.5}$ | $Cv_3$ |

FIG. 5B

| Effective Cont Width ($\mu$m) | | gc (in multiple of design rule space) | | | | |
|---|---|---|---|---|---|---|
| | | 1X | 1.5X | 2X | 3X | ... |
| CC (multiple of design rule space) | 1X | $\lambda_{1,1}$ | $\lambda_{1,1.5}$ | $\lambda_{1,2}$ | $\lambda_{1,3}$ | ... |
| | 1.5X | $\lambda_{1.5,1}$ | $\lambda_{1.5,1.5}$ | $\lambda_{1.5,2}$ | $\lambda_{1.5,3}$ | ... |
| | 2X | $\lambda_{2,1}$ | $\lambda_{2,1.5}$ | $\lambda_{2,2}$ | $\lambda_{2,3}$ | ... |
| | 2.5X | $\lambda_{2.5,1}$ | $\lambda_{2.5,1.5}$ | $\lambda_{2.5,2}$ | $\lambda_{2.5,3}$ | ... |
| | 3X | $\lambda_{3,1}$ | $\lambda_{3,1.5}$ | $\lambda_{3,2}$ | $\lambda_{3,3}$ | ... |
| | ... | ... | ... | ... | ... | ... |

FIG. 7A

| Effective Via Width ($\mu$m) / Via Density | 1X | 1.5X | 2X | 2.5X | 3X |
|---|---|---|---|---|---|
| | $\sigma_1$ | $\sigma_{1.5}$ | $\sigma_2$ | $\sigma_{2.5}$ | $\sigma_3$ |

FIG. 7B

ACCURATE PARASITIC CAPACITANCE EXTRACTION FOR ULTRA LARGE SCALE INTEGRATED CIRCUITS

This application is a divisional of U.S. patent application Ser. No. 12/893,870, filed on Sep. 29, 2010, entitled "Accurate Parasitic Capacitance Extraction for Ultra Large Scale Integrated Circuits," now U.S. Pat. No. 8,214,784, which is a divisional of U.S. patent application Ser. No. 11/865,304, filed on Oct. 1, 2007, entitled "Accurate Parasitic Capacitance Extraction for Ultra Large Scale Integrated Circuits," now U.S. Pat. No. 7,818,698, which claims the benefit of U.S. Provisional Application No. 60/947,269, filed on Jun. 29, 2007, entitled "Method And System to Enable Design Optimization of Via and Contact," which applications are hereby incorporated herein by reference in their entireties.

CROSS-REFERENCE TO RELATED APPLICATIONS

This application relates to the following commonly assigned patent application: Ser. No. 11/966,653, filed Dec. 28, 2007, entitled "Accurate Capacitance Measurement for Ultra Large Scale Integrated Circuits," now U.S. Pat. No. 7,772,868, which application is hereby incorporated herein by reference.

TECHNICAL FIELD

The present invention relates generally to integrated circuit design, and more particularly to extracting parasitic capacitance in a semiconductor device.

BACKGROUND

Integrated circuits ("ICs") vary in complexity from, for example, an analog circuit comprising only a few basic electronic components, such as transistors and diodes, to a complex digital system including hundreds of millions of transistors. Although different design methods and Electronic Design Automation ("EDA") tools are arranged to design ICs of various levels of complexity, the fundamental process of IC design remains unchanged. That is, IC design engineers design an integrated circuit by transforming a circuit specification into geometric descriptions of physical components that creates the basic electronic components. In general, the geometric descriptions are polygons of various dimensions, representing conductive features located in different processing layers. The detailed geometric descriptions of physical components are generally referred to as integrated circuit layouts. After the creation of an initial integrated circuit layout, the integrated circuit layout is usually tested and optimized through a set of steps in order to verify that the integrated circuit meets the design specification and will perform as desired.

Shown in FIG. 1 is a flowchart that illustrates the common post-design testing and optimization steps. After an integrated circuit design process is completed (shown at 2), an initial integrated circuit layout is created (shown at 4). The layout is first design-rule checked and then verified to be equivalent with the desired design schematic. This step (shown at 6) is generally referred to as design-rule check (DRC) and layout versus schematic (LVS).

The step of RC extraction (shown at 8) is subsequently performed in order to "extract" electrical characteristics of the layout. The common electrical characteristics that are extracted from an integrated circuit layout include capacitance and resistance in the electronic devices and on the various interconnects (also generally referred to as "nets") that electrically connect the aforementioned devices. The current step is also referred to as "parasitic extraction" because these capacitance and resistance values are not intended by the designer but rather result from the underlying device physics of the device configurations and materials used to fabricate the IC.

The designed IC is then simulated (shown at 10) to insure the design meets the specification with the parasitic capacitance and resistance in the IC. If the parasitic capacitance and resistance causes undesirable performance, the integrated circuit layout is typically changed through one or more design optimization cycles. If the simulation results satisfy the design specification, the design process is completed (shown at 12).

It is known that the parasitic capacitance and resistance can cause various detrimental effects in a designed IC, such as undesired long signal delays on the nets. Thus, the impact of the parasitic capacitance and resistance on the performance of the designed IC must be accurately predicted so that design engineers can compensate for these detrimental effects through proper design optimization steps.

It is also recognized that, when device feature sizes shrink down to the ultra-deep submicron range (less than 0.25 micron), interconnect delays begin to dominate the total delay in an IC. Moreover, because of the reduced contact-to-gate electrode distance and increased device density in ICs made with advanced technology, contact/via capacitance accounts for an increasing proportion of the total interconnect delay, when compared with coupling capacitance between adjacent nets.

The existing extraction methodology is problematic in contact/via parasitic capacitance extraction. Currently, extraction efforts are mainly focused on the coupling capacitance between adjacent nets. The parasitic effects on the contacts and vias are addressed with much less accuracy. The lack of extraction accuracy on contact and via capacitance may cause large discrepancies between simulated results and actual circuit performance.

As an example, an existing full-chip extracting system is typically "polygon-based." In extracting a design layout, a circuit layout is first divided into small pieces wherein each small piece contains a recognized primitive polygon pattern (also generally referred to as primitive). The extraction system, then, extracts parasitic values (e.g., resistance, capacitance) by reading a pre-made, parasitic capacitance/resistance look-up table typically stored in a technology file (shown at 9) for the per-unit parasitic value of such a primitive polygon pattern. The full-chip parasitic value is usually obtained by arithmetic operations on the primitive geometric patterns. The actual contact/via shapes and size variations are generally ignored by the extracting system.

FIG. 2A shows a perspective view of a MOSFET transistor occurring in an IC, where contacts "C" having a cylindrical shape and variation in size are made from the first interconnect layer "M1" to the source/drain regions "S" and "D." In an existing parasitic extracting system as described above, the actual contact shape and variation in size are not taken into account. Instead, a per-unit capacitance value, usually derived from an ideal, square-shaped contact primitive, is usually used to calculate the contact-to-gate-electrode parasitic capacitance in the transistor. As a result, the simulated results can be overly pessimistic with a margin of over 10%.

FIG. 2B shows a perspective view of a portion in an IC, where vias having a cylindrical shape and variation in size are formed between the first interconnect layer "M1" and the second interconnect layer "M2." Similarly, during RC extraction step 8 in an existing full-chip extracting system, parasitic capacitance between vias and via-to-metal-layer is roughly estimated without taking account of the actual via shape, via density and variation in size.

SUMMARY OF THE INVENTION

These and other problems are generally solved or circumvented, and technical advantages are generally achieved, by preferred embodiments of the present invention which provides a full-chip parasitic extraction method with improved accuracy.

In accordance with a preferred embodiment of the present invention, a method of electronically generating a technology file for extracting parasitic capacitance in an integrated circuit layout comprises the steps of providing a plurality of contact/via capacitance test structures, having substantially similar dimensions and different contact/via configurations, measuring parasitic contact/via capacitance on said plurality of test structures, creating an effective contact/via width table, wherein each element of said table corresponds to a polygon-shaped contact/via and has a calculated parasitic capacitance matching to that of one of said plurality of test structures, and generating a capacitance table corresponding to said effective contact/via width table.

In accordance with another preferred embodiment of the present invention, a method of extracting a parasitic capacitance of one or more contact/via in an integrated circuit layout comprises the steps of reading a technology file into an extraction system, and reading a circuit layout into said extraction system, wherein said technology file includes an capacitance table, wherein the contact/via capacitance in said capacitance table is derived from an effective contact/via area table, wherein each element of said effective contact/via area table is calibrated to have a parasitic capacitance value matching with that of an actual contact/via configuration in an IC.

In accordance with yet another preferred embodiment of the present invention, a method of conducting testing and simulation on an integrated circuit layout comprises the steps of creating a technology file, processing the geometry of an integrated circuit layout, and extracting parasitic capacitance by pattern-matching a contact/via configuration in said technology file from a pattern in said integrated circuit layout, wherein said technology file includes an capacitance table, wherein the contact/via capacitance in said capacitance table is derived from an effective contact/via area table, wherein each element of said effective contact/via area table is calibrated to have a parasitic capacitance value matching with that of an actual contact/via configuration in an IC.

An advantage of a preferred embodiment of the present invention is that parasitic capacitance associated with actual contact/via shapes and size variations are extracted with substantially improved accuracy. This is achieved without overhauls on existing "polygon-based" full-chip extraction tools.

A further advantage of a preferred embodiment of the present invention is that once the accuracy of an "Effective Contact Width" and "Effective via Width" table in preferred embodiments are verified passing a quality assurance (QA) criteria by a silicon vendor, the technology file derived thereupon can be released to any design teams. IC designers do not need to change an established extraction flow.

BRIEF DESCRIPTION OF THE DRAWINGS

For a more complete understanding of the present invention, and the advantages thereof, reference is now made to the following descriptions taken in conjunction with the accompanying drawings, in which:

FIG. 4 shows two MOSFET transistors, having identical device dimensions and different contact configurations;

FIG. 5A illustrates one example of an indexed $C_{co\text{-}po}$ table in a preferred embodiment;

FIG. 5B illustrates one example of an indexed Cv table in a preferred embodiment;

FIG. 7A shows one example of an "Effective Contact Width" table in a preferred embodiment;

FIG. 7B shows one example of an "Effective via Width" table in a preferred embodiment;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a parasitic capacitance extraction method that takes account of the actual contact/via shapes and size variations. A common feature of the various embodiments is to replace the ideal, square-shaped contact/via configuration, which is used to "extract" the full-chip parasitic capacitance, with an indexed "Effective Contact Width" table and "Effective via Width" table, respectively. Each element of such a table represents an ideal, squared-shaped contact/via configuration that is used by an existing "polygon-based" parasitic extraction tools, and yet the area of each element is calibrated so that its corresponding parasitic capacitance is equal to that of an actual contact/via configuration occurring in an IC. Through the above "mapping" operation, the existing "polygon-based" extraction EDA tools can be readily used to accurately extract the parasitic capacitance on contacts/vias with "real-world" configurations. Further, once a calibrated "Effective Contact Width" or "Effective via Width" table is created and the corresponding EDA technology file is generated, it is "portable" to other design projects using the same processing technology. The details of the preferred embodiments will be manifested through the following descriptions.

Figure 3:
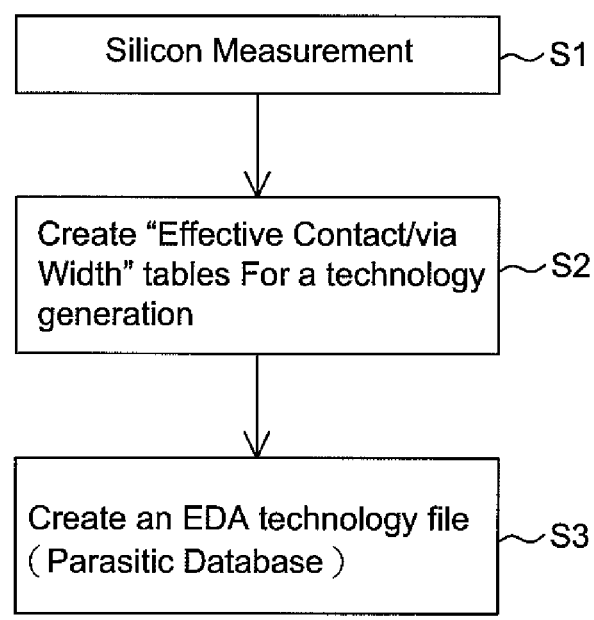
FIG. 3 is a flowchart of generating a technology file in a prefer embodiment.

Referring first to FIG. 3, a flowchart is illustrated showing example steps executed to generate a technology file for the full-chip parasitic extraction EDA tools. As known in the art, a technology file is usually used to provide process technology information into various extraction EDA tools. The information may include design rules for device placement and interconnect routing, process information for the interconnect layers, thickness of conductive layer, and resistivities of the conductive layers. An existing technology file for full-chip parasitic extraction also typically includes a pre-generated capacitance table that comprises contact/via capacitance values derived from an ideal, square-shaped contact/via configuration. The pre-generated capacitance table may be used to determine the parasitic resistance and capacitance values in a circuit layout.

In contrast, a technology file according to one embodiment of the present invention includes a pre-generated capacitance table that comprises contact/via capacitance values derived from an "Effective Contact Width" and an "Effective via Width" table. These tables are configured such that each element of such a table has an extraction-tool-recognizable, squared-shaped contact/via configuration, yet its corresponding parasitic capacitance is calibrated to be equal to that of an actual contact/via configuration occurring in an IC.

A first step (shown as S1) in the flowchart involves measuring the actual contact-to-gate-electrode parasitic capacitance on MOS transistors having different contact configurations, and via-to-via, via-to-metal-layer parasitic capacitance on via test structures having different via configurations. The measuring of the contact-to-gate-electrode capacitance is usually performed through bench tests on MOSFET test structures formed in a semiconductor substrate. In doing so, a plurality of MOS transistors is formed preferably on a silicon wafer scribe line, each having a substantially identical device dimension. The MOS transistors of the plurality differ in how contacts are made from a first interconnect layer to the source/drain regions. The different contact configurations used in the MOSFET test structures are reflected through variations in contact density and contact-to-gate electrode distance, and are representative of those that are actually occurring in an IC. Preferably, the contact density and contact-to-gate electrode distance are multiples of the minimum design rule contact-to-contact spacing (it translates to maximum design rule contact density) and contact-to-gate-electrode spacing, respectively. Moreover, the contacts have the "real-world" cylindrical and tapered shape, and yet vary in contact size.

Figure 1:
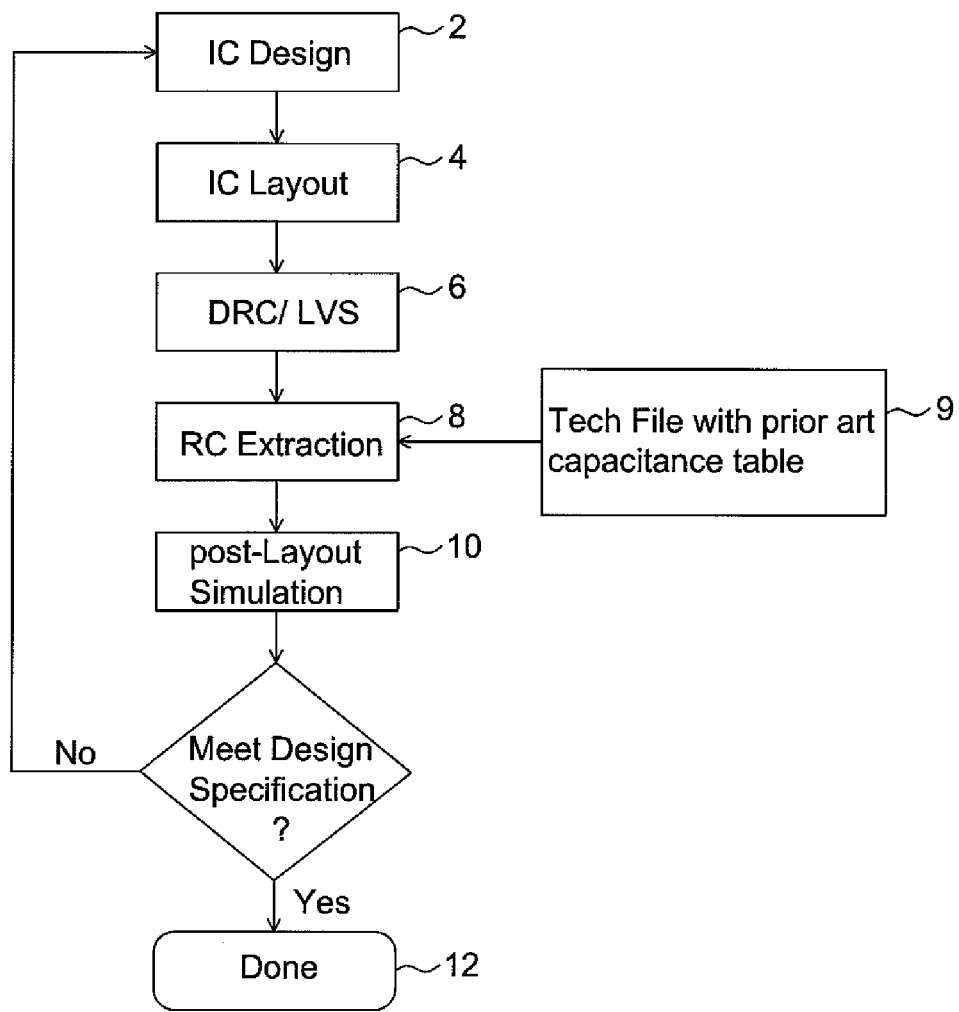
FIG. 1 is a flowchart of a prior art post-design testing and optimization flow.
Figure 2A:
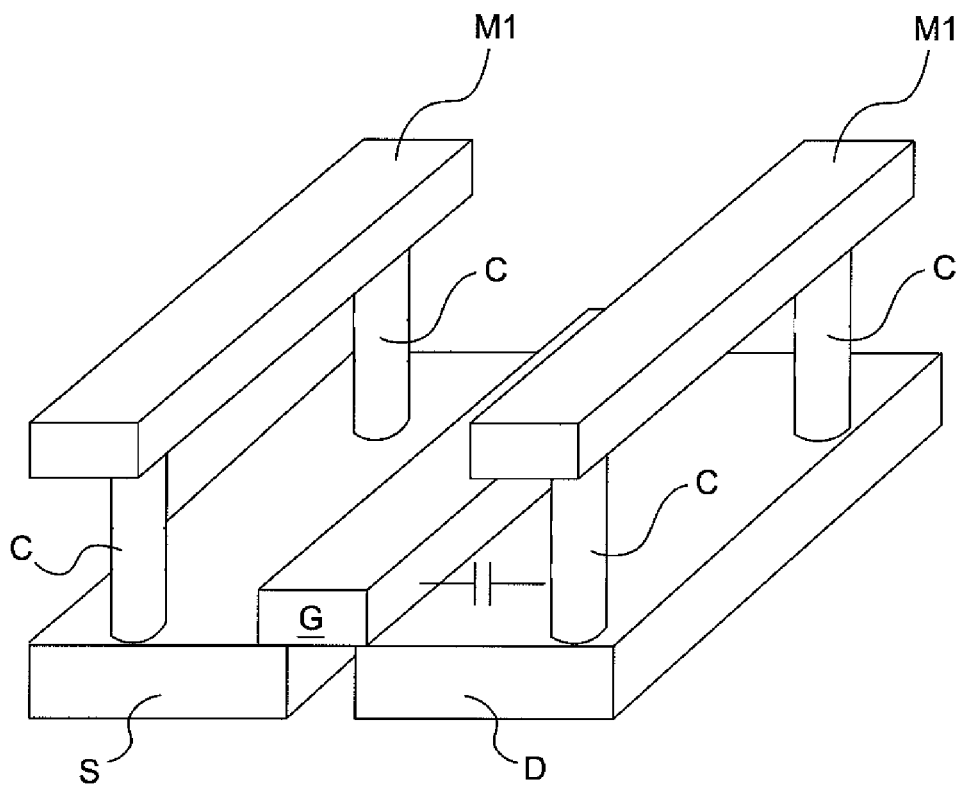
FIG. 2A shows a perspective view of a MOSFET transistor.
Figure 2B:
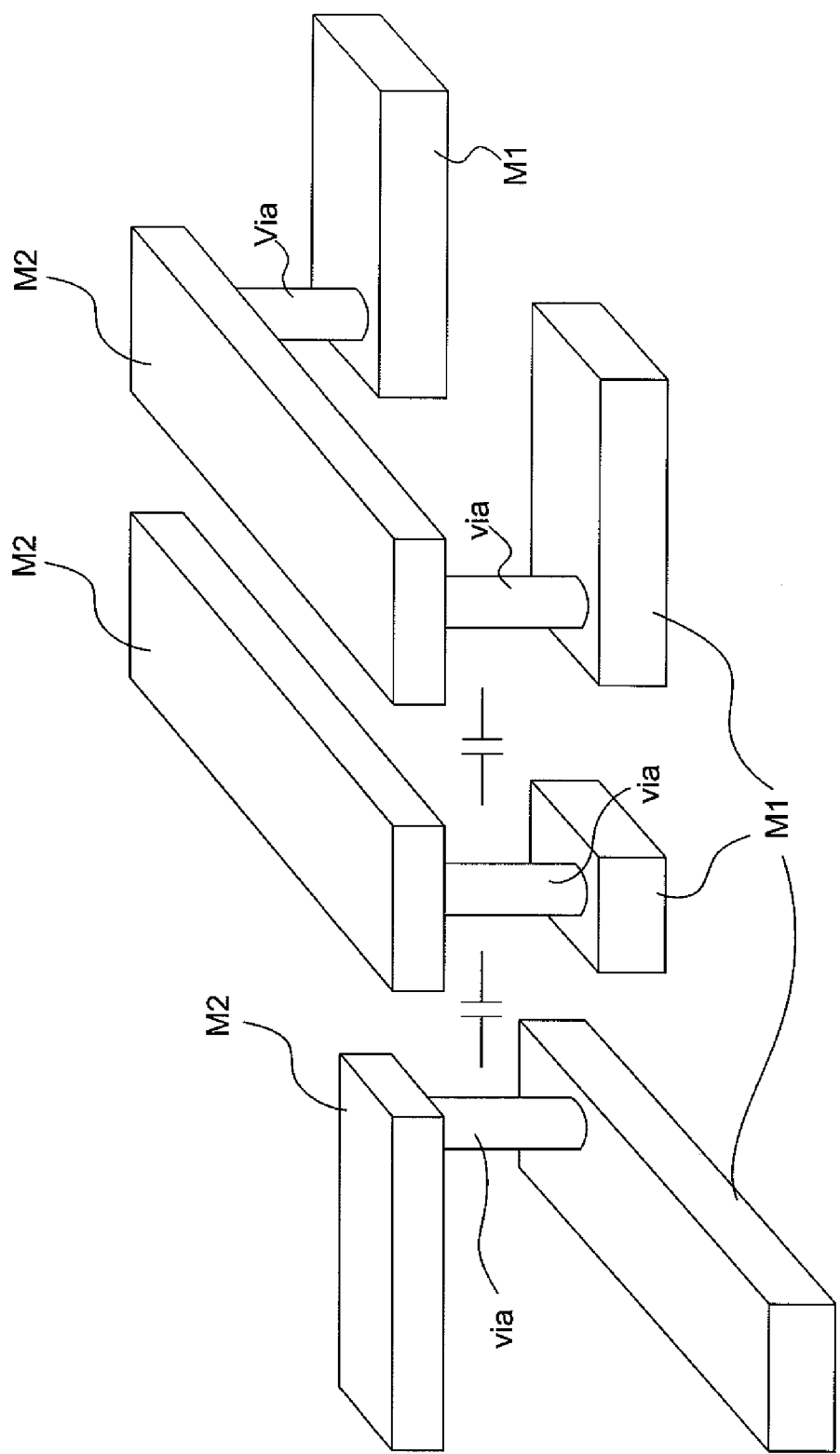
FIG. 2B shows a perspective view of vias in an IC.

FIG. 4 shows an example of this aspect, wherein MOSFET "A" and "B" similar to that shown in FIG. 2, have identical device dimensions, but different contact configurations. The contact density and contact-to-gate electrode distance are labeled as "cc" and "gc." A contact configuration can be shortly represented by the appropriate multiples. For example, MOSFET "A" has a contact configuration of 1× by 1×, which indicates a minimum design rule contact-to-contact spacing and contact-to-gate-electrode spacing. In contrast, MOSFET "B" has a contact configuration of 3× by 3×.

In the circumstances of measuring via-to-via, via-to-metal-layer parasitic capacitance, a plurality of via test structures is provided located preferably on a silicon wafer scribe line, having different via configurations formed between a first and second interconnect metal layers. Also, the different via configurations are reflected through variations in via density, and are representative of those that are actually occurring in an IC, having a cylindrical shape and varying in via size and density. The via density is usually measured as a multiple of the minimum design rule via-to-via spacing (it translates to maximum design rule via density).

In an embodiment, parasitic contact and via capacitance are measured through known methods. In an additional and/or alternative embodiment, parasitic contact and via capacitance are measured with improved accuracy through use of methods disclosed in commonly assigned U.S. patent application Ser. No. 11/966,653 filed on Dec. 28, 2007, and entitled "Accurate Capacitance Measurement for Ultra Large Scale Integrated Circuits," now U.S. Pat. No. 7,772,868, which application is incorporated herein by reference. Per-unit values are derived for each of the different contact/via configurations. The values corresponding to the different contact/via configurations are then tabulated, forming an indexed contact capacitance table and an indexed via capacitance table.

FIG. 5A shows one example of an indexed contact capacitance (shown as $C_{co\text{-}po}$) table of this aspect. Preferably, the $C_{co\text{-}po}$ table includes measured $C_{co\text{-}po}$ values corresponding to "cc" and "gc" of the contact configurations occurring in an IC. For example, $C_{1.5, 2}$ in the table is the per-unit, contact-to-gate-electrode parasitic capacitance when "cc" is one and half times (1.5×) the design rule contact-to-contact spacing and "gc" is twice (2×) the design rule contact-to-gate-electrode spacing. In practice, a $C_{co\text{-}po}$ value in the table, such as $C_{1.5, 2}$, is obtained preferably through measurements on a plurality of MOSFET test structures having an identical contact configuration, thus yielding improved statistical accuracy. For example, in one preferred embodiment, a MOS transistor array of 100×100 is created and the total contact-to-gate capacitance on the 10000 MOS transistors is measured. A per-unit contact-to-gate capacitance is subsequently derived.

FIG. 5B shows one example of an indexed via capacitance (shown as $C_v$) table obtained in a similar manner. The table includes measured $C_v$ values of via configurations occurring in an IC. A $C_v$ value typically includes via-to-via, and via-to-metal-layer parasitic capacitance. These via configurations are indexed with respect to their corresponding via density, which is usually measured as a multiple of the minimum design rule via-to-via spacing.

It is desirable that the contact/via configurations used in the above bench test be so diversified that the different contact/via configurations in an actual IC will be tested and the corresponding $C_{co\text{-}po}$, $C_v$ values be obtained at step S1. Therefore, the contact/via configurations should not be limited to those that are shown in the example of FIGS. 5A and 5B.

Referring back to FIG. 3, a second step (shown as S2) in the flowchart of generating a technology file for full-chip extraction involves creating "Effective Contact Width" and "Effective via Width" tables for a process technology generation. This involves first "mapping" each $C_{co\text{-}po}$, $C_v$ value obtained from silicon measurement in S1 to a similar contact/via configuration having ideal, square-shaped contacts/vias, which can be "recognized" by an existing "polygon-based" full-chip extraction tool, such as SYNOPSYS Inc.'s STAR-RCXT®. In preferred embodiments, the "mapping" is conducted by making use of a known three-dimensional (3-D) field solver, such as SYNOPSYS Inc.'s RAPHAEL®. A field solver is a specialized software program that solves Maxwell's equations. A field solver can calculate the capacitance value of the possible primitives for the various different surrounding conditions in a circuit layout, including the contact-to-gate-electrode, via-to-via, and via-to-metal-layer parasitic capacitance.

In mapping an actual contact configuration having a measured $C_{co\text{-}po}$ to a contact configuration having ideal, square-shaped contacts, a process characterization file (also called ICT file in SYNOPSYS Inc.'s RAPHAEL®) is first prepared, specifying process and technology related information, such as the minimum spacing and minimum width of conductive layers, the thickness and physical attributes of the conductive and dielectric layers. In a preferred embodiment, the process characterization file also includes corresponding contact density measured in "cc," contact-to-gate electrode distance measured in "gc," and a trial value of a contact area that has an ideal, square-shaped configuration. The process characterization file is subsequently read into a known field solver. Alternatively, contact density "cc," contact-to-gate electrode distance "gc," and the trial value of a contact area can be read into the field solver through a separate step. Using this information, the field solver will identify a large number of primitives for the various different surrounding conditions, and calculates the capacitance for all the primitives. Among the capacitance solution is the per-unit, contact-to-gate-electrode parasitic capacitance value. This calculation step repeats with various trial values of contact area until the calculated contact-to-gate-electrode parasitic capacitance matches with the corresponding measured $C_{co-po}$ in an indexed $C_{co-po}$ table, such as that shown in FIG. 5A. The contact area under this condition is subsequently defined as the "effective" contact area of an actual contact configuration. Preferably, this step is automated using a software routine. After step S2, an actual contact configuration is "mapped" to an ideal, square-shaped contact configuration having a matched parasitic contact-to-gate-electrode capacitance.

Figure 6:
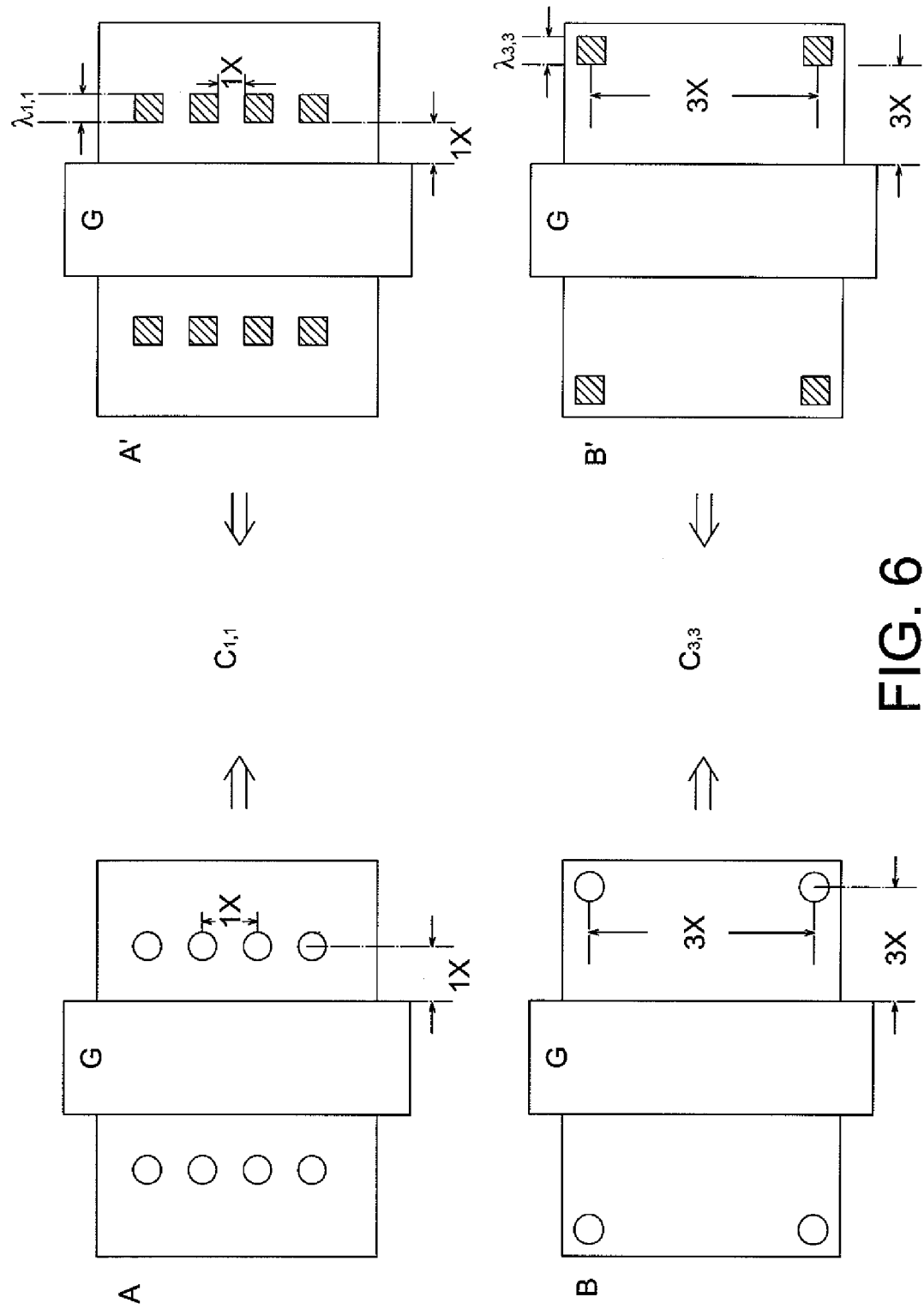
FIG. 6 illustrates in layout view on obtaining an "effective" contact area of an actual contact configuration.

FIG. 6 is an example, illustrating in layout view of obtaining the "effective" contact areas for MOSFET "A" and "B" that are shown in FIG. 4. As described above and shown in the example with respect to FIG. 4, MOSFET "A" has a 1× by 1× contact configuration and a measured $C_{co-po}$ value of $C_{1,1}$. MOSFET "B" has a 3× by 3× contact configuration and a measured $C_{co-po}$ value of $C_{3,3}$. Through step S2 as described above, MOSFET "A" and "B" are "mapped" to MOSFET "A'" and "B'," respectively. MOSFET "A'" and "B'" have an ideal, square-shaped contact configuration, thus, recognizable by the existing "polygon-based" EDA extraction tool. In the meantime, MOSFET "A'" and "B'" have parasitic contact-to-gate-electrode capacitance matching to that of MOSFET "A" and "B," respectively. In FIG. 6, "effective" contact areas of MOSFET "A" and "B" are represented in term of their contact widths "$\lambda_{1,1}$" and "$\lambda_{3,3}$," respectively.

Similar operation is carried out in "mapping" an actual via configuration to an ideal, square-shaped via configuration having a matched parasitic via capacitance. The area of the ideal, square-shaped via thus obtained is generally referred to as the "effective" via area of an actual via configuration. The "effective" via area is typically represented in term of its via width "σ".

Staying in S2 of FIG. 3, the process of determining the "effective" contact/via area of an actual contact/via configuration, as described above, is repeated on each of the MOSFET and via test structures provided in step S1. Various known field solvers may be employed to calculate the "effective" contact/via area, such as SYNOPSYS Inc.'s RAPHAEL®. The field solvers may use different approaches, such as finite difference method, finite element method, boundary element method, or Monte Carlo. Regardless of the field solvers used, the level of accuracy and computational intensity are factors to be considered. In general, a result having a 3-D accuracy and obtained within a reasonable period of time is preferred. As a result of step S2, an "Effective Contact Width" and "Effective via Width" table are obtained, wherein each element corresponds to an ideal, square-shaped contact/via configuration having a matched parasitic capacitance with as an actual contact/via configuration occurring in an IC.

FIG. 7A shows one example of an "Effective Contact Width" table of this aspect. The table is indexed with respect to the contact density measured in "cc" and contact-to-gate-electrode distance measured in "gc" of an actual contact configuration. Preferably, "cc" and "gc" are represented in a multiple of the minimum design rule contact-to-contact spacing and contact-to-gate-electrode spacing, respectively.

An "Effective via Width" table is obtained in a similar manner. An example is shown in FIG. 7B. It is noted, however, that via configurations vary significantly when comparing those occurring between lower interconnect layers and those occurring between upper interconnect layers in an IC. For example, vias between lower interconnect layers are much smaller and denser than those formed between upper interconnect layers in an IC. Therefore, in a preferred embodiment, a separate "Effective via Width" table is preferably created for vias between each of the two different interconnect layers.

In an additional and/or alternative embodiment, a single effective via width is used for vias between two interconnect layers, replacing an "Effective via Width" table. This can lead to reduced computational intensity in the extraction system, thus achieving faster extraction.

Referring back to FIG. 3, a third step (shown as S3) in the flowchart involves creating an embodied EDA technology file in correspondence with a process technology generation. In this aspect, an "Effective Contact Width" and "Effective via Width" table obtained from S2 are subsequently read into a field solver together with a process characterization file, such as that used in S2. In a preferred embodiment, the field solver used in S3 is one embedded in SYNOPSYS Inc.'s STAR-RCXT®, although other field solvers with matching accuracy are not excluded. An embodied EDA technology file is then generated by running the field solver, and the created capacitance table in the embodied EDA technology file includes contact/via capacitance values derived from the "Effective Contact Width" and "Effective via Width" table. The created capacitance table also includes capacitance of primitives other than that of contact/via parasitic capacitance. Usually, the embodied EDA technology file thus generated is interchangeably referred to as a "Parasitic Database." This embodied EDA technology file can be readily supplied to various design projects using the same processing technology, and used for the various EDA tools, including full-chip extraction tools.

Figure 8:
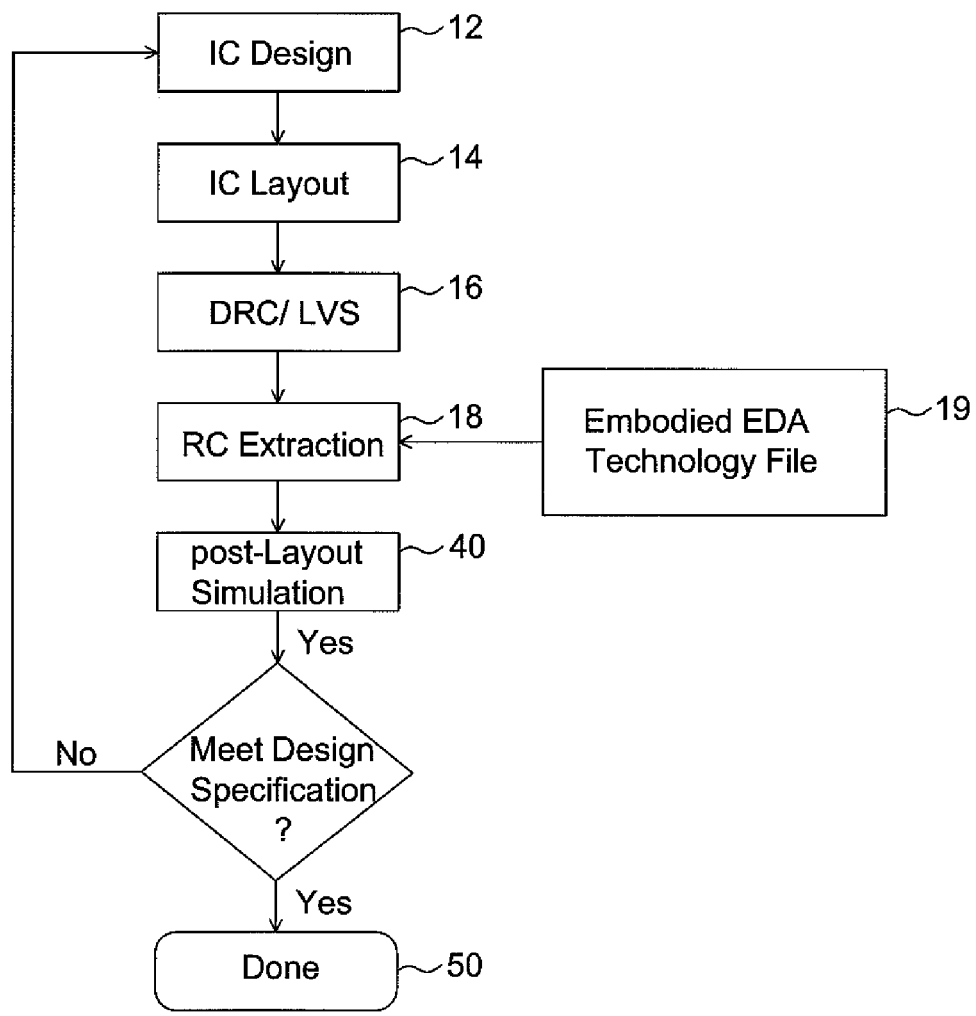
FIG. 8 illustrates a flowchart of post-design testing and optimization flow in a preferred embodiment.

FIG. 8 illustrates a flowchart of post-design testing and optimization steps in a preferred embodiment. Integrated circuit design 12 is completed and initial integrated circuit layout 14 is created. Alternatively, Step 16 follows to conduct DRC/LVS check. A full-chip parasitic extraction is launched in a "polygon-based" extraction system 18. Embodied EDA technology file 19, including contact/via capacitance table derived from an embodied "Effective Contact Width" and "Effective via Width" table, is read into extraction system 18 before running extraction. Embodied EDA technology file 19 is pre-generated through steps described with respect to FIG. 3.

Figure 9:
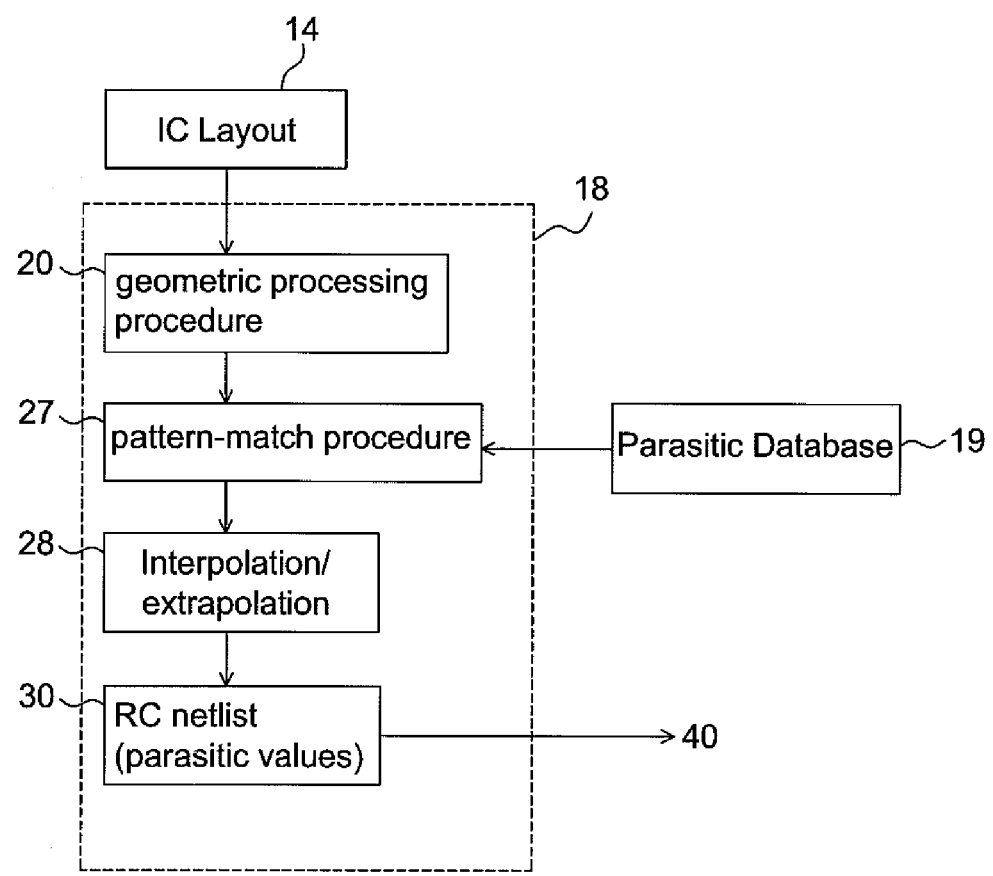
FIG. 9 shows a block diagram of extraction system in a preferred embodiment.

FIG. 9 shows a block diagram of extraction system 18 in a preferred embodiment. In operation, "Parasitic Database" 19 obtained in S3 with respect to FIG. 3 is first read into full-chip extraction system 18. Extraction system 18 also receives IC layout 14 and analyzes the conductive polygons in layout 14 by geometric processing procedure 20. A pattern-matching operation 27 is conducted on results from geometric processing procedure 20. If a contact/via configuration in layout 14 is identical with one stored in "Parasitic Database" 19, contact/via capacitance can be directly retrieved from the pre-generated capacitance table in "Parasitic Database" 19. In case pre-made "Parasitic Database" 19 does not contain an exact matching entry from layout 14, contact/via capacitance extraction is conducted through "interpolation" and/or "extrapolation" 28 on the primitives stored in "Parasitic Database" 19. Parasitic capacitance/resistance on other conductive features in layout 14 is extracted in extraction system 18 through known methods, such as formulas, pre-calculated capacitance tables, and the like. Full-chip parasitic extraction result 30 is represented by a known format, such as a netlist of RC values annotated on each node of the designed circuit. The Full-chip parasitic extraction result 30 is then read into post-layout simulation tool 40, which is shown in FIG. 8.

Back to FIG. 8, a simulation step 40 is carried out. If parasitic extraction value 30 causes undesirable performance, circuit layout 14 is changed through one or more design optimization cycles. If the simulation results satisfy the design specification, the design process is completed in step 50.

It is noted that, in order to obtain accurate post-layout simulation result, a contact-to-gate-electrode capacitance in a front-end MOSFET SPICE model should not be used for post-layout simulation. A front-end MOSFET SPICE model is developed for pre-layout simulation before a circuit layout is generated. The contact-to-gate-electrode capacitance defined therein is obtained through measurements on MOSFET test structures having a maximum design rule contact density. This is suitable for a pre-layout simulation where a worst-case time delay estimation is desirable at an early stage of a design. However, after the circuit layout is created, a post-layout simulation with the accurate RC extraction is generally desirable. In preferred embodiments, capacitance table in embodied EDA technology file 19 is provided to the simulation tool in order to obtain accurate post-layout simulation results. In doing so, the contact capacitance in a front-end MOSFET SPICE model is deactivated by "turning off" proper switches in the SPICE model file.

Advantageous features of the preferred post-design testing and optimization steps include, but nor limited to, the following. First, parasitic capacitance associated with actual contact/via shapes and size variations are extracted with substantially improved accuracy. Second, accurate parasitic extraction on contacts/vias is achieved without overhauls on existing "polygon-based" extraction tools. Third, once the accuracy of an "Effective Contact Width" table and "Effective via Width" table are verified passing a quality assurance (QA) criteria by a silicon vendor, the subsequently generated technology file can be released to any design teams. IC designers do not need to change an established extraction flow.

In another embodiment of the current invention, "Effective Contact Width" and "Effective via Width" tables are generated for different process corners, which include best process corner, typical process corner and worst process corner. Process characterization file of each process corner is used for step S2 with respect to FIG. 3 in obtaining an "Effective Contact Width" and "Effective via Width" table under different process corner. Technology file in correspondence with each process corner can be subsequently generated through step S3 with respect to FIG. 3.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
   reading a technology file into an extraction system; and
   reading a circuit layout into said extraction system;
   wherein said technology file includes a capacitance table;
   wherein a connector capacitance in said capacitance table is derived from an effective connector area table; and
   wherein each element of said effective connector area table is calibrated to have a parasitic capacitance value matching with a measured parasitic capacitance of an actual connector configuration in an integrated circuit (IC), said actual connector configuration including a via, a contact, or a combination thereof.

2. The method of claim 1, wherein said each element of said effective connector table has a polygon-shaped connector.

3. The method of claim 2, wherein said each element in said effective connector area table is represented by a width of a square-shaped connector.

4. The method of claim 1, wherein said effective connector area table includes an effective via area table corresponding to vias between two different interconnect layers in said IC.

5. The method of claim 1 further comprising pattern-matching a geometry of said circuit layout to a corresponding element of said capacitance table.

6. The method of claim 5 further comprising retrieving said element of said capacitance table.

7. The method of claim 1 further comprising forming said actual connector configuration in a semiconductor substrate.

8. A method comprising:
   reading a technology file into an extraction system;
   reading a circuit layout into said extraction system;
   processing a geometry of said circuit layout in said extraction system; and
   using said extraction system, extracting parasitic capacitance by pattern-matching a connector configuration in said technology file to a pattern in said circuit layout;
   wherein said technology file includes a capacitance table;
   wherein a connector capacitance in said capacitance table is derived from an effective connector area table; and
   wherein each element of said effective connector area table is calibrated to have a parasitic capacitance value matching with a measured parasitic capacitance of an actual connector configuration in an integrated circuit (IC), said actual connector configuration including a via, a contact, or a combination thereof.

9. The method of claim 8 further comprising creating said technology file including:
   providing connector capacitance test structures having substantially similar dimensions and different connector configurations;
   measuring a parasitic connector capacitance on each of said connector capacitance test structures;
   creating an effective connector width table, wherein each element of said effective connector width table corresponds to a polygon-shaped connector and has a calculated parasitic capacitance matching to a measured parasitic capacitance of one of said connector capacitance test structures; and
   generating a capacitance table corresponding to said effective connector width table.

10. The method of claim 9, wherein said creating said effective connector width table includes:
provide said measured parasitic capacitance;
preparing a process characterization file, said process characterization file including a trial value of a connector area;
calculating a connector parasitic capacitance value by using a field solver with said process characterization file; and
comparing the calculated connector parasitic capacitance value with the measured parasitic capacitance to determine an effective connector width.

11. The method of claim 8, further comprising extracting parasitic capacitance by interpolating or extrapolating capacitance values in said capacitance table of said technology file.

12. The method of claim 8 further comprising outputting a parasitic extraction result in a netlist of RC values.

13. The method of claim 8 further comprising performing a simulation based on said circuit layout using said extracted parasitic capacitance.

14. The method of claim 13 further comprising optimizing said circuit layout based on said performing said simulation.

15. The method of claim 13, wherein said actual connector configuration in said IC includes vias in a first dielectric layer over and adjoining a semiconductor substrate and/or includes contacts in a second dielectric layer over and adjoining said first dielectric layer.

16. The method of claim 13 further comprising forming said actual connector configuration in a semiconductor substrate.

17. The method of claim 8, wherein said each element of said effective connector table has a polygon-shaped connector.

18. The method of claim 17, wherein said each element in said effective connector area table is represented by a width of a square-shaped connector.

19. The method of claim 8, wherein said effective connector area table includes an effective via area table corresponding to vias between two different interconnect layers in said IC.

20. The method of claim 8 further comprising retrieving said connector configuration of said capacitance table.

* * * * *